United States Patent
Kang et al.

(10) Patent No.: US 6,952,965 B2
(45) Date of Patent: Oct. 11, 2005

(54) VERTICAL MEMS GYROSCOPE BY HORIZONTAL DRIVING

(75) Inventors: Seok-jin Kang, Suwon-si (KR);
Seok-whan Chung, Suwon-si (KR);
Moon-chul Lee, Sungnam-si (KR);
Kyu-dong Jung, Suwon-si (KR);
Seog-soo Hong, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 10/744,099

(22) Filed: Dec. 24, 2003

(65) Prior Publication Data

US 2004/0226369 A1 Nov. 18, 2004

(30) Foreign Application Priority Data

Dec. 24, 2002 (KR) .................................. 10-2002-82983

(51) Int. Cl.[7] .............................................. G01P 9/04
(52) U.S. Cl. ................................ 73/504.12; 73/504.02; 73/504.14
(58) Field of Search ..................... 73/504.12, 504.14, 73/504.02, 504.04, 514.32, 514.29, 514.16

(56) References Cited

U.S. PATENT DOCUMENTS

| | | | | |
|---|---|---|---|---|
| 6,044,707 A | * | 4/2000 | Kato ....................... | 73/504.14 |
| 6,430,998 B2 | * | 8/2002 | Kawai et al. ............. | 73/504.12 |
| 6,736,008 B2 | * | 5/2004 | Kumagai et al. ......... | 73/504.14 |
| 6,761,068 B1 | * | 7/2004 | Schmid .................... | 73/504.14 |
| 6,789,423 B2 | * | 9/2004 | An et al. .................. | 73/504.04 |
| 6,810,737 B2 | * | 11/2004 | Kawai ...................... | 73/504.02 |
| 2003/0110858 A1 | * | 6/2003 | Kim et al. ................ | 73/504.02 |

* cited by examiner

Primary Examiner—Helen C. Kwok
(74) Attorney, Agent, or Firm—Lee & Morse, P.C.

(57) ABSTRACT

A vertical MEMS gyroscope by horizontal driving includes a substrate, a support layer fixed on an upper surface of an area of the substrate, a driving structure floating above the substrate and having a portion fixed to an upper surface of the support layer and another portion in parallel with the fixed portion, the driving structure having a predetermined area capable of vibrating in a predetermined direction parallel to the substrate, a detecting structure fixed to the driving structure on a same plane as the driving structure, and having a predetermined area capable of vibrating in a vertical direction with respect to the substrate, a cap wafer bonded with the substrate positioned above the driving structure and the detecting structure, and a fixed vertical displacement detection electrode formed at a predetermined location of an underside of the cap wafer, for detecting displacement of the detecting structure in the vertical direction.

10 Claims, 5 Drawing Sheets

HORIZONTAL GYROSCOPE

VERTICAL GYROSCOPE BY VERTICAL DRIVING

VERTICAL GYROSCOPE BY HORIZONTAL DRIVING

VERTICAL MEMS GYROSCOPE BY HORIZONTAL DRIVING

BACKGROUND

1. Field of the Invention

The present invention relates to a micro electromechanical system (MEMS) gyroscope for measuring rotational angular velocity of various devices. More particularly, the present invention relates to a vertical MEMS gyroscope by horizontal driving in which motions of a driving mass and detection mass are performed independently of each other.

2. Description of the Related Art

Gyroscopes, well known for rotational angular velocity detection, have been widely used in many areas, and are particularly important as a core part of navigation equipment in ships and airplanes. Nowadays, the development of the gyroscope has enabled application of the same in areas such as navigation systems for automobiles and hand-tremor compensation devices for high-resolution video cameras.

Gyroscope operation is based on the Coriolis force. When there is a certain mass vibration in a certain direction, say, in a direction of a first axis, and a rotational force of a certain angular velocity is applied at a right angle to the mass vibration, i.e., in a direction of a second axis, a Coriolis force is generated in a direction of a third axis, which is at a right angle to the first and second axes.

In order to generate and detect the Coriolis force, the gyroscope is provided with a mass and a detection electrode, which vibrate in a certain direction. Hereinbelow, the direction in which the mass of the gyroscope vibrates will be called a 'driving direction', and a direction in which rotational angular velocity is input with respect to the gyroscope will be called an 'input direction'. Also, a direction in which a Coriolis force of the mass is detected will be called a 'detecting direction'.

In space, the driving direction, the input direction and the detecting direction are set at right angles to each other. Usually, in the MEMS gyroscope, three coordinate axes are set, including two directions which are parallel to a plane of a substrate and perpendicular to each other (hereinafter called a 'horizontal direction'), and one direction at a right angle with the plane of the substrate (hereinafter called a 'vertical direction').

Gyroscopes are usually divided into two types, i.e., a horizontal type (Z-axis) and a vertical type (X- or Y-axis). A horizontal gyroscope has horizontal driving and detecting directions and a vertical (Z-axis) input direction, while a vertical gyroscope has a horizontal (X or Y axis) input direction.

In a conventional horizontal type gyroscope that uses a silicon on insulator (SOI) structure, an angular velocity that is input about a Z-axis, which is perpendicular to a plane of a substrate, can be measured, but an angular velocity in two axes on a same plane cannot be measured. Accordingly, in order to measure multiple-axis angular velocity, a process of arranging an element vertically is additionally required, which causes a considerable increase in cost, as well as degradation in reliability and performance.

It has been suggested to detect rotational angular velocity in a horizontal direction using a vertical MEMS gyroscope. In order to detect the angular velocity input in the horizontal direction (X- or Y-axis), a driving electrode that drives a mass vertically or a detection electrode that detects vertical displacement of the mass is required.

A conventional way to fabricate a vertical driving or detection electrode is to form a fixed electrode on a substrate and a motion electrode at a predetermined distance upwardly from the fixed electrode. When the fixed electrode and motion electrode are used as a driving electrode, a variable voltage is applied between the motion electrode and the fixed electrode to drive the motion electrode. When the fixed electrode and motion electrode are used as a detection electrode, an electrostatic force varying in accordance with the distance between the fixed electrode and the motion electrode is detected. Therefore, the angular velocity is measured.

However, a structure in which a motion electrode is formed upwardly from a fixed electrode has a shortcoming in terms of a complicated fabricating process. In order to fabricate the electrodes, first, the fixed electrode is fixed on the substrate and a sacrificial layer is deposited on the fixed electrode. Then the motion electrode is formed on the sacrificial layer and the sacrificial layer is removed.

Furthermore, the distance between the motion electrode and the fixed electrode should be small in order to precisely measure displacement of the motion electrode in the vertical direction. However, this may cause an adherence of the motion electrode and the fixed electrode.

FIG. 1A illustrates a sectional view of a horizontal MEMS gyroscope, and FIG. 1B illustrates a sectional view of a vertical MEMS gyroscope by vertical driving. Referring to FIGS. 1A and 1B, there is a support layer 110, 210 on a substrate 100, 200, and a MEMS structure 500, 600 is formed on the support layer 110, 210. There is a cap wafer 150, 250, which is attached to an upper portion of the MEMS structure 500, 600. The cap wafer 150, 250 is attached to the upper portion of the MEMS structure 500, 600 in a vacuum chamber. In order to secure sufficient space to maintain a vacuum inside the gyroscope, there is a predetermined space 160, 260 defined at a lower portion of the cap wafer 150, 250.

The MEMS structure 500, 600 includes a driving structure 120, 220, a detecting structure 130, 230, and an electrode anchor 140, 240. The MEMS structure 500, 600 is floating above the substrate 100, 200 with a part thereof being fixed to the support layer 110, 210. Albeit not shown in FIGS. 1A and 1B, the driving structure 120, 220 includes a driving mass, which vibrates in a predetermined direction, a driving electrode, which drives the driving mass and a detection electrode, which detects any displacement that occurs by the vibration of the driving mass. The detecting structure 130, 230 includes a detection mass, which vibrates in a predetermined direction, and a detection electrode which detects any displacement of the detection mass. Electric signals from respective detection electrodes are output to an external electrode 180, 280 through the electrode anchor 140, 240 and a via hole 170, 270 formed through the external electrode 180, 280.

In the case of a horizontal MEMS gyroscope, the respective detection electrodes for detecting the displacement of the driving mass and the detection mass are on a same plane as the driving mass and the detection mass, and respective motion electrodes vibrate in the horizontal direction together with the corresponding masses.

However, in the case of a horizontal MEMS gyroscope by vertical driving, the structure of the driving electrode for driving the driving mass in the vertical direction with respect to the substrate, and the structure of the detection electrode for detecting the displacement of the driving mass are different from those of the detection electrode of the detection mass. In a driving electrode and a detection electrode of comb-structure that are formed on a side of the driving mass, a motion electrode vibrating in a vertical direction should be shorter than a vertical length of a fixed electrode. Accordingly, a fabrication process becomes complicated, and a vertical MEMS gyroscope cannot be fabricated together with a horizontal MEMS gyroscope. Further, when the driving mass is driven vertically by the driving electrode formed at the side of the driving mass, the displacement of the driving mass is non-linear.

SUMMARY OF THE INVENTION

Accordingly, it is a feature of an embodiment of the present invention to provide a vertical MEMS gyroscope by horizontal driving requiring a same fabrication process as that of a horizontal gyroscope, by forming on a cap wafer a detection electrode for detecting displacement of a detection mass which is vibrated by a rotational force applied in a direction that is vertical to a driving direction of a driving mass, and a fabricating method thereof.

In an effort to provide the above and other features and advantages of the present invention, a vertical MEMS gyroscope by horizontal driving is provided, including a substrate, a support layer fixed on an upper surface of a particular area of the substrate, a driving structure floating above the substrate and having a portion thereof fixed to an upper surface of the support layer and another portion in parallel with the fixed portion, the driving structure having a predetermined area capable of vibrating in a predetermined direction parallel to the substrate, a detecting structure fixed to the driving structure on a same plane as the driving structure, and having a predetermined area capable of vibrating in a vertical direction with respect to the substrate, a cap wafer positioned above the driving structure and the detecting structure, and bonded with the substrate, and a fixed vertical displacement detection electrode formed at a predetermined location of an underside of the cap wafer, for detecting displacement of the detecting structure in the vertical direction.

In the vertical MEMS gyroscope by horizontal driving the driving structure preferably includes a driving mass capable of vibrating in a predetermined direction parallel to the substrate, a plurality of support beams each having one end fixed on the upper surface of the support layer and another end fixed on a side of the driving mass, for enabling the driving mass to move in a predetermined horizontal direction, a driving electrode for driving the driving mass in the predetermined horizontal direction and a horizontal displacement detection electrode for measuring a displacement of the driving mass in a horizontal direction. The driving electrode preferably has a comb structure including a fixed driving electrode fixed on the upper surface of the support layer and a motion driving electrode formed on a side of the driving mass. The horizontal displacement detection electrode preferably has a comb structure including a fixed horizontal displacement detection electrode fixed on the upper surface of the support layer, and a motion horizontal displacement detection electrode formed on a side of the driving mass.

In the vertical MEMS gyroscope by horizontal driving, the detecting structure preferably includes a detection mass capable of vibrating in a vertical direction with respect to the substrate, a plurality of support beams each having an end fixed on a side of the detection mass and another end fixed on a side of the driving mass, for enabling the detection mass to move in the vertical direction with respect to the substrate and a motion vertical displacement detection electrode for measuring a displacement of the detection mass in a vertical direction.

The motion vertical displacement detection electrode preferably includes a comb-structured electrode which is formed on a side of the detection mass.

The cap wafer preferably has a vacuum space formed therein except an area for the fixed vertical displacement detection electrode, the vacuum space of the cap wafer being larger than the area for the fixed vertical displacement detection electrode so as to maintain a predetermined vacuum inside the substrate and the wafer.

The vertical MEMS gyroscope by horizontal driving may further include a detection electrode anchor arranged on the upper surface of the support layer and electrically connected with the fixed vertical displacement detection electrode.

Preferably, the cap wafer includes a via hole formed therein, and the detection electrode anchor is electrically connected with an external electrode through the via hole.

It is a feature of another embodiment of the present invention to provide a fabrication method for a vertical MEMS gyroscope by horizontal driving, including forming a structure wafer for forming a substrate, a support layer, a detection electrode anchor, a driving structure capable of vibrating in a predetermined direction parallel to the substrate, and a detecting structure capable of vibrating in a vertical direction with respect to the substrate, forming a cap wafer, forming a fixed vertical displacement detection electrode at a predetermined location of an underside of the cap wafer for detecting displacement of the detecting structure in the vertical direction with respect to the substrate, anodic-bonding the structure wafer and the cap wafer together and forming an external electrode which is electrically connected with the fixed vertical displacement detection electrode.

Forming the structure wafer preferably includes forming a multi-layer in which a substrate, an insulation layer and a conductive layer are stacked on each other, forming an etching hole in the conductive layer according to a structure mask and etching and removing the insulating layer except for an area for the support layer.

Forming the cap wafer preferably includes forming an electrode gap pattern corresponding to an electrode to measure a vertical displacement of the detecting structure, forming a pattern corresponding to an interior vacuum space of the substrate and the cap wafer and forming a via hole for connecting the detection electrode anchor and the external electrode.

The anodic-bonding is preferably performed in a vacuum chamber to vacuumize the interior of the substrate and the wafer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENT

Figure 1A:
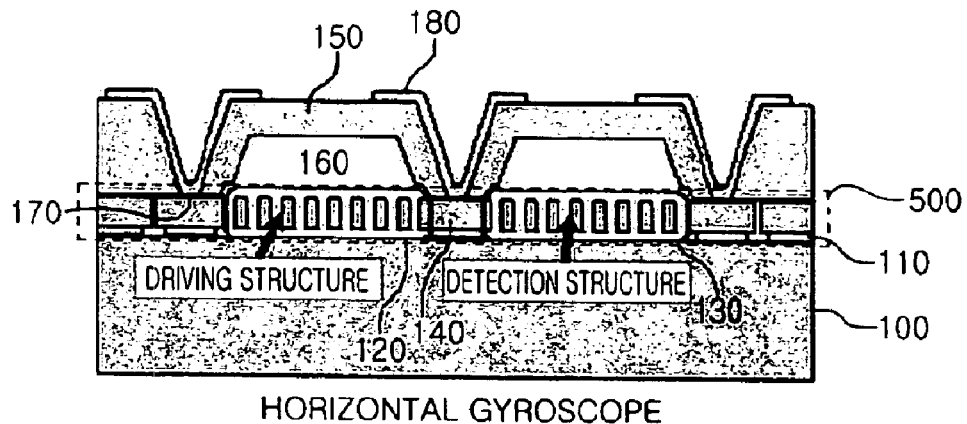
FIG. 1A illustrates a sectional view of a conventional horizontal MEMS gyroscope.
Figure 1B:
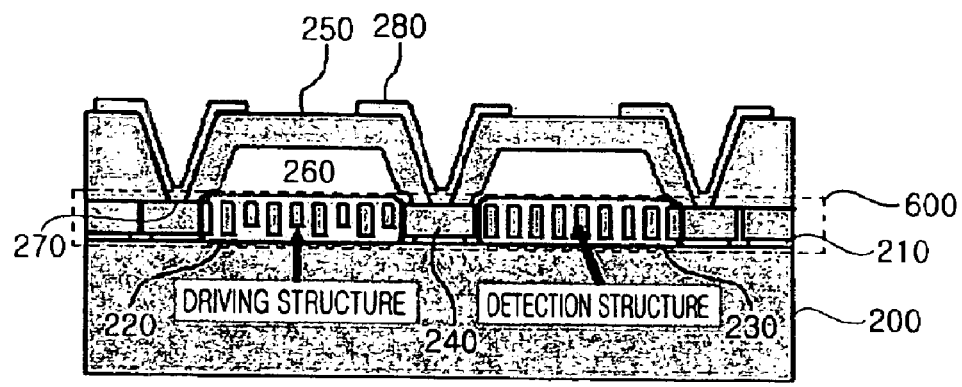
FIG. 1B illustrates a sectional view of a conventional vertical MEMS gyroscope by vertical driving.

Korean Patent Application No. 2002-82983, filed on Dec. 24, 2002, and entitled: "Vertical Mems Gyroscope By Horizontal Driving And Fabrication Method Thereof" is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numerals refer to like elements throughout.

Figure 2:
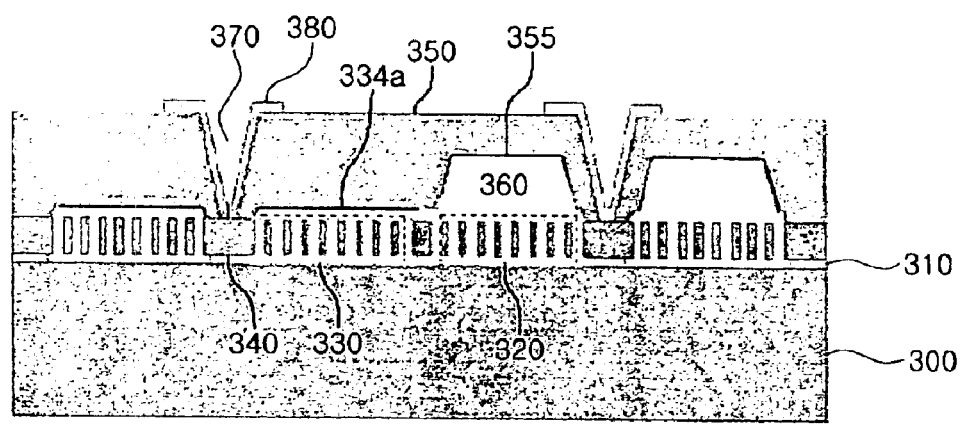
FIG. 2 illustrates a sectional view of a vertical MEMS gyroscope by horizontal driving according to an embodiment of the present invention.

FIG. 2 illustrates a schematic sectional view showing a vertical MEMS gyroscope by horizontal driving according to an embodiment of the present invention. As shown in FIG. 2, the vertical MEMS gyroscope by horizontal driving includes a substrate 300, a support layer 310, a driving structure 320, a detecting structure 330, a fixed vertical displacement detection electrode 334a, which is fixed, a cap wafer 350 having an underside 355 and a via hole 370, an external electrode 380 and an interior space 360.

Referring to FIG. 2, the support layer 310, i.e., a 3 $\mu$m-thick silicon oxide $SiO_2$ film, is formed on a predetermined region of the silicon Si substrate 300, i.e., a 525 $\mu$m-thick silicon substrate.

A MEMS structure floats above and parallel to the substrate 300, with a part of the MEMS structure being fixed to an upper portion of the support layer 310. The MEMS structure includes the driving structure 320, the detecting structure 330 and a detection electrode anchor 340, and is formed to have a thickness of 40 $\mu$m.

Figure 3:
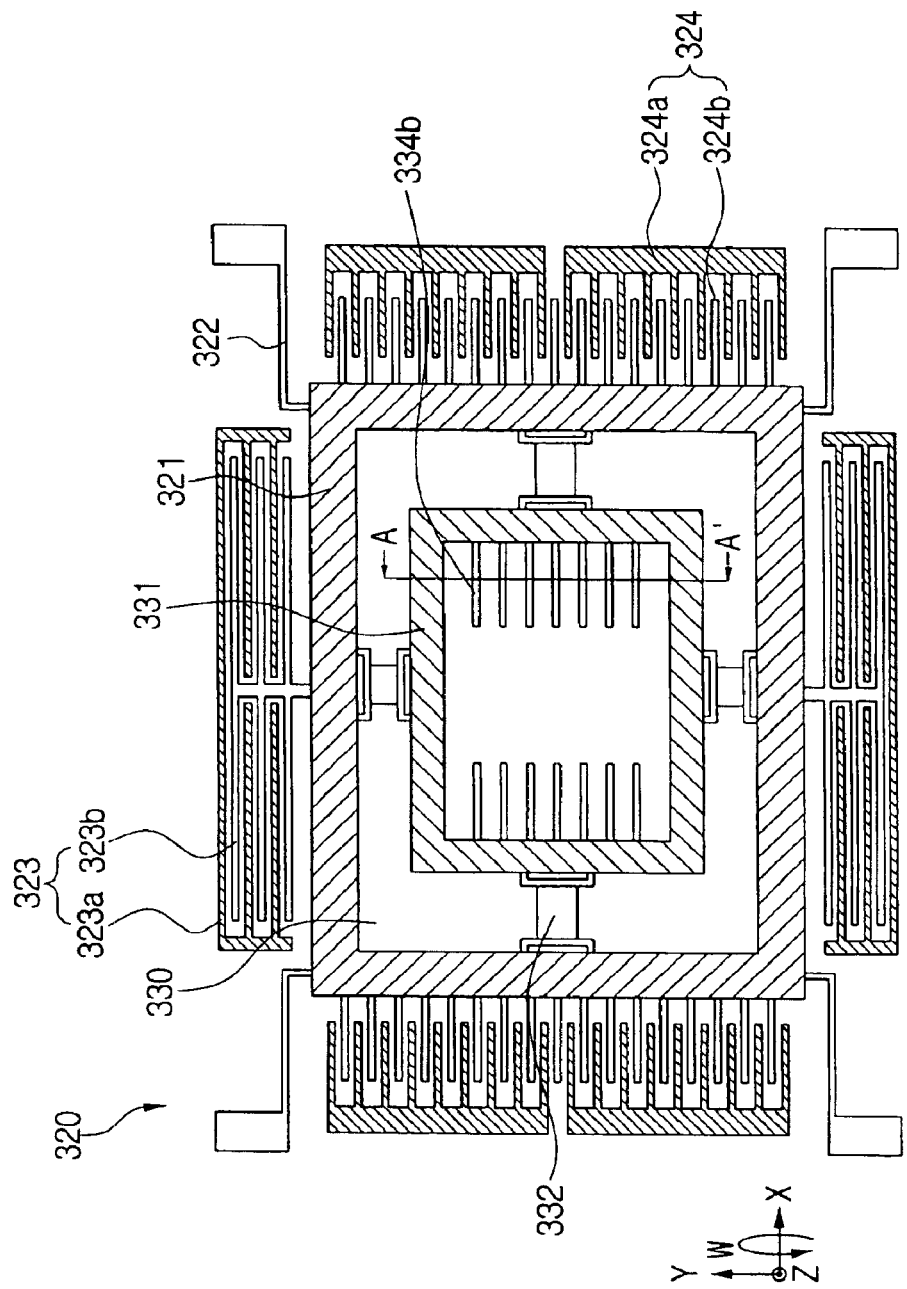
FIG. 3 illustrates a plan view of the vertical (X-axis) MEMS gyroscope by horizontal driving of FIG. 2.

FIG. 3 illustrates a plan view of the driving structure 320 and the detecting structure 330 of the vertical (X-axis) MEMS gyroscope by horizontal driving of FIG. 2. The driving structure 320 includes a driving mass 321, a plurality of driving mass support beams 322, a plurality of driving electrodes 323, and a plurality of horizontal displacement detection electrodes 324.

In the absence of an external force, the driving mass 321 floats above the substrate 300 while being fixed to the plurality of driving mass support beams 322, which are resilient in a direction of the Y-axis. The driving electrode 323 is formed of a comb structure that includes a fixed driving electrode 323a partially fixed on an upper surface of the support layer 310 of FIG. 2, and a motion driving electrode 323b disposed on upper and lower faces of the driving mass 321. When an AC voltage is supplied to the driving electrode 323, the driving mass 321 vibrates in the Y-axis direction. A frequency of the vibration is set to approximately 8 kHz. The horizontal displacement detection electrode 324 is formed of a comb structure including a fixed horizontal displacement detection electrode 324a partially fixed on left and right sides of the upper surface of the support layer 310, and a motion horizontal displacement detection electrode 324b formed on left and right sides of the driving mass 321. When the driving mass 321 vibrates in the Y-axis direction, the motion horizontal displacement detection electrode 324b also vibrates in the Y-axis direction. The horizontal displacement detection electrode 324 detects an electrostatic capacity variation between the fixed horizontal displacement detection electrode 324a and the motion horizontal displacement detection electrode 324b in accordance with a relative distance therebetween.

The detecting structure 330 includes a detection mass 331, a plurality of detection mass support beams 332 and a motion vertical displacement detection electrode 334b. The detection mass 331 is connected with the driving mass 321 through the plurality of detection mass support beams 332, which are resilient in the Z-axis direction, and is positioned in a same plane as the driving mass 321. When the driving mass 321 is driven, the detection mass 331 vibrates in the Y-axis direction together with the driving mass 321. When a rotational external force having an angular velocity $\Omega$ is input to the driving mass 321 in a direction of the X-axis and to the detection mass 331 in a direction of the Y-axis vibration, the driving mass 321 and the detection mass 331 are subject to a Z-axis Coriolis force. Here, only the detection mass 331, being connected to the plurality of detection mass support beams 332, which are elastically deformable in the Z-axis direction, is vibrated by the Coriolis force in the Z-axis direction.

Figure 4:
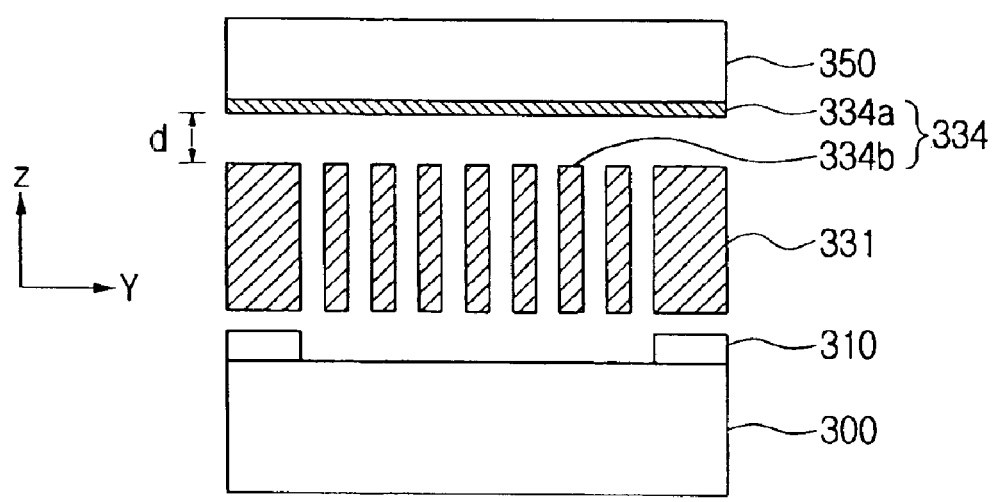
FIG. 4 illustrates a sectional view showing a structure of a fixed electrode for detecting vertical displacement of a vertical MEMS gyroscope by horizontal driving according to the present invention.

FIG. 4 illustrates a sectional view of the fixed vertical displacement detection electrode 334a of FIG. 2. A vertical displacement detection electrode 334 detects the vertical displacement of the detection mass 331, and includes the fixed vertical displacement detection electrode 334a formed at an underside of the cap wafer 350, and a motion vertical displacement detection electrode 334b formed at a side of the detection mass 331. As the detection mass 331 vibrates, electrostatic capacitance between the two electrodes 334a and 334b varies. Here, the electrostatic capacitance is in inverse-proportion to the distance d between the two electrodes 334a and 334b. By measuring a variation of the electrostatic capacitance between the two electrodes 334a and 334b, the vertical (Z-axis) displacement of the detection mass 331 and the Coriolis force may be calculated.

The Coriolis force in the direction of the Z-axis is in proportion to a vector cross product of a Y-axis moving or vibrational velocity and the X-axis rotational angular velocity generated by the rotational external force applied to the driving mass 321. Accordingly, the Coriolis force and moving or vibrational velocity of the driving mass 321 may be obtained from the electrostatic capacitance measured from the horizontal and vertical displacement detection electrodes 324, 334. Also, the externally-input rotational angular velocity may be obtained.

Because a MEMS structure is micro-compact, it is very sensitive to fine dust and contaminants, as well as to a feeble electric signal. Therefore, as illustrated in FIG. 2, the cap wafer 350, which may be formed of a material such as glass, is fixed on the upper surface of the substrate 300 where the MEMS structure is disposed. Also, according to the present invention, because a micro-element should be vibrated at a frequency of several kHz, a vacuum is created in interior space 360. Accordingly, a predetermined vacuum is maintained by recessing the cap wafer area deeper than the fixed horizontal displacement detection electrode 334a. Further, a film of getter material such as titanium Ti is formed on the underside 355 of the cap wafer 350 to absorb air and dust.

Referring to FIGS. 2 and 3, when an X-axis rotating force having an angular velocity Ω is input to the driving mass 321 and the detection mass 331 vibrating in the direction of the Y-axis, the detection mass 331 is subject to the Z-axis Coriolis force and thus vibrates in the Z-axis direction. In order to detect the Z-axis displacement of the detection mass 331, the motion vertical displacement detection electrode 334b having a comb-structure is provided at an inner side of the detection mass 331, and the fixed vertical displacement detection electrode 334a is provided at the underside 355 of the cap wafer 350 in a position corresponding to an upper portion of the detecting structure 330. The detection electrode anchor 340 at the upper surface of the support layer 310 is formed of a conductive material, and is electrically connected to the motion vertical displacement detection electrode 334b, so as to output electric signals to the external electrode 380 through the via hole 370 formed in the cap wafer 350.

Figure 5:
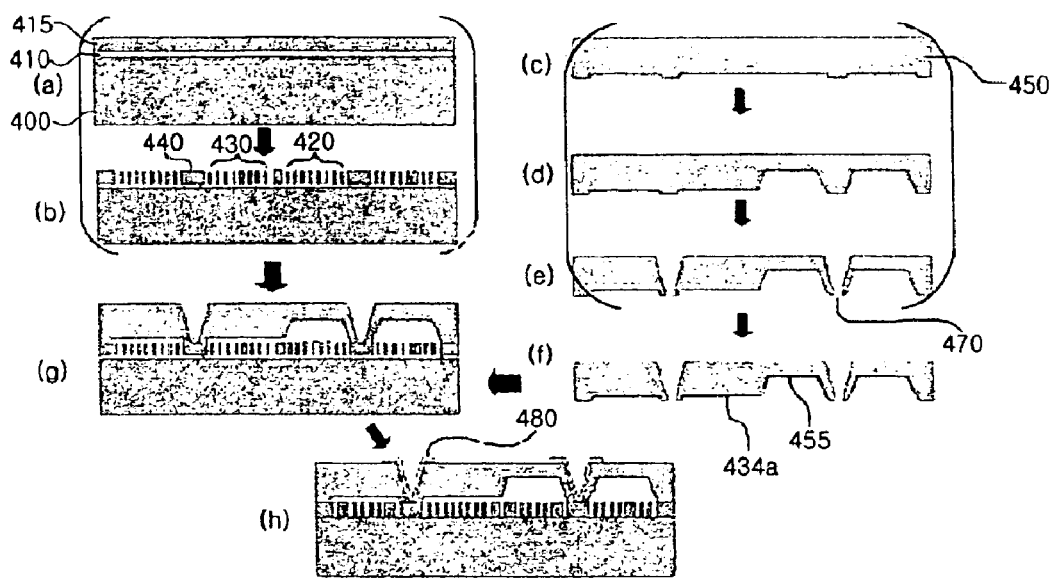
FIG. 5 illustrates a view showing a fabricating process of a vertical MEMS gyroscope by horizontal driving according to the present invention.

FIGS. 5a to 5h show processes of fabricating the vertical MEMS gyroscope by horizontal driving according to an embodiment of the present invention. Referring to FIGS. 5a to 5h, the fabrication process of the vertical MEMS gyroscope by horizontal driving includes forming a structure wafer (FIGS. 5a and 5b); forming a cap wafer (FIGS. 5c to 5e); forming a fixed vertical displacement detection electrode (FIG. 5f); bonding the structure wafer and the cap wafer (FIG. 5g); and forming an external electrode (FIG. 5h).

Forming a structure wafer for forming a substrate, a support layer and a MEMS structure includes forming a multi-layer in which a substrate 400, an insulation layer 410 and a conductive layer 415 are stacked on each other (FIG. 5a); forming an etching hole in the conductive layer 415 according to a structure mask; and etching and removing the insulating layer 410 except for the support layer area (FIG. 5b).

In forming the multi-layer, the insulating layer 410 is formed on the silicon substrate 400, which may be approximately 525 μm thick, by forming an approximately 3 μm-thick silicon oxide $SiO_2$ layer through a chemical reaction of either oxygen or vapor with a surface of the silicon substrate 400 at a temperature between 800° C. and 1200° C. Next, a silicon conductive layer 415, which will form an approximately 40 μm-thick MEMS structure, is formed on an upper surface of the silicon oxide $SiO_2$ layer.

Forming the cap wafer preferably includes forming an electrode gap pattern corresponding to an electrode to measure a vertical displacement of the detecting structure, forming a pattern corresponding to an interior vacuum space of the substrate and the cap wafer and forming a via hole for connecting the detection electrode anchor and the external electrode.

Forming the cap wafer includes forming an electrode gap pattern (FIG. 5c); forming a pattern for a vacuum space (FIG. 5d); and forming a via hole (FIG. 5e).

More specifically, a glass substrate 450 is etched so that a predetermined pattern for a fixed vertical displacement detection electrode 434a of the MEMS structure is formed (FIG. 5c), and then a pattern 455 for a space sufficient to maintain a predetermined inside vacuum is formed (FIG. 5e). Then, a via hole 470 is formed at a position corresponding to the detection electrode anchor 440 (FIG. 5f) so that the detection electrode anchor 440 may be connected to an external electrode 480.

In order to form an electrode on the underside of the cap wafer 450, a titanium Ti layer is formed on an area of the fixed vertical displacement detection electrode 434a and the pattern area 455. The titanium Ti layer serves to maintain a vacuum state of the interior space and also to absorb dust.

For stable operation of the MEMS structure, two interior spaces of the cap wafer 450 should be maintained at a predetermined vacuum. Accordingly, the structure wafer of FIG. 5b and the cap wafer of FIG. 5f are anodic bonded with each other in a vacuum chamber.

According to the present invention, by constructing a detection electrode for detecting vertical displacement of a detection mass on a cap wafer, a fabrication process is simplified and a vertical MEMS gyroscope with improved reliability may be provided. Further, because the vertical MEMS gyroscope of the present invention has the same fabrication process as that of a horizontal gyroscope, it is easy to fabricate a 3-axis MEMS gyroscope by constructing first and second horizontal axes on the same substrate.

Preferred embodiments of the present invention have been disclosed herein and, although specific terms are employed, they are used and are to be interpreted in a generic and descriptive sense only and not for the purpose of limitation. Accordingly, it will be understood by those of ordinary skill in the art that various changes in form and details may be made without departing from the spirit and scope of the present invention as set forth in the following claims.

What is claimed is:

1. A vertical MEMS gyroscope by horizontal driving, comprising:
    a substrate;
    a support layer fixed on an upper surface of a particular area of the substrate;
    a driving structure floating above the substrate and having a portion thereof fixed to an upper surface of the support layer and another portion in parallel with the fixed portion, the driving structure having a predetermined area capable of vibrating in a predetermined direction parallel to the substrate;
    a detecting structure fixed to the driving structure on a same plane as the driving structure, and having a predetermined area capable of vibrating in a vertical direction with respect to an upper surface of the substrate;
    a cap wafer positioned above the driving structure and the detecting structure, and bonded with the substrate, the cap wafer defining an interior space above the driving structure; and
    a fixed vertical displacement detection electrode formed on an underside of the cap wafer above the detecting surface, for detecting displacement of the detecting structure in the vertical direction.

2. The vertical MEMS gyroscope by horizontal driving as claimed in claim 1, wherein the driving structure comprises:
    a driving mass capable of vibrating in a predetermined direction parallel to the substrate;
    a plurality of support beams each having one end fixed on the upper surface of the support layer and another end fixed on a side of the driving mass, for enabling the driving mass to move in a predetermined horizontal direction;
    a driving electrode for driving the driving mass in the predetermined horizontal direction; and
    a horizontal displacement detection electrode for measuring a displacement of the driving mass in a horizontal direction.

3. The vertical MEMS gyroscope by horizontal driving as claimed in claim 2, wherein the driving electrode has a comb structure including a fixed driving electrode fixed on the upper surface of the support layer and a motion driving electrode formed on a side of the driving mass.

4. The vertical MEMS gyroscope by horizontal driving as claimed in claim 2, wherein the horizontal displacement detection electrode has a comb structure including a fixed horizontal displacement detection electrode fixed on the upper surface of the support layer, and a motion horizontal displacement detection electrode formed on a side of the driving mass.

5. The vertical MEMS gyroscope by horizontal driving as claimed in claim 1, wherein the detecting structure comprises:

a detection mass capable of vibrating in a vertical direction with respect to the substrate;

a plurality of support beams each having an end fixed on a side of the detection mass and another end fixed on a side of the driving structure, for enabling the detection mass to move in the vertical direction with respect to the substrate; and a motion vertical displacement detection electrode for measuring a displacement of the detection mass in a vertical direction.

6. The vertical MEMS gyroscope by horizontal driving as claimed in claim 5, wherein the motion vertical displacement detection electrode comprises a comb-structured electrode which is formed on a side of the detection mass.

7. The vertical MEMS gyroscope by horizontal driving as claimed in claim 1, wherein the interior space formed within the cap wafer is a vacuum space formed adjacent to the fixed vertical displacement detection electrode, the vacuum space of the cap wafer being larger than an area for the fixed vertical displacement detection electrode so as to maintain a predetermined vacuum between the substrate and the cap wafer.

8. The vertical MEMS gyroscope by horizontal driving as claimed in claim 1, further comprising a detection electrode anchor arranged on the upper surface of the support layer and electrically connected with the fixed vertical displacement detection electrode.

9. The vertical MEMS gyroscope by horizontal driving as claimed in claim 8, further comprising:

a via hole formed in the cap wafer; and an external electrode, wherein the detection electrode anchor is electrically connected to the external electrode through the via hole.

10. The vertical MEMS gyroscope by horizontal driving as claimed in claim 2, wherein the detecting structure comprises:

a detection mass capable of vibrating in a vertical direction with respect to the substrate;

a plurality of support beams each having an end fixed on a side of the detection mass and another end fixed on a side of the driving mass, for enabling the detection mass to move in the vertical direction with respect to the substrate; and a motion vertical displacement detection electrode for measuring a displacement of the detection mass in a vertical direction.

* * * * *